United States Patent
Prentice et al.

(10) Patent No.: US 11,239,918 B2
(45) Date of Patent: Feb. 1, 2022

(54) REDUCTION OF SECOND-ORDER NON-LINEAR DISTORTION IN A WIDEBAND COMMUNICATION SYSTEM

(71) Applicant: ZINWAVE, LTD., Dallas, TX (US)

(72) Inventors: John Prentice, Haslingfield (GB); Alessandro Bertoneri, Cambridge (GB); Chris Potter, Fulbourn (GB)

(73) Assignee: Zinwave, Ltd., Dallas, TX (US)

( * ) Notice: Subject to any disclaimer, the term of this patent is extended or adjusted under 35 U.S.C. 154(b) by 0 days.

(21) Appl. No.: 17/020,327

(22) Filed: Sep. 14, 2020

(65) Prior Publication Data

US 2020/0412455 A1    Dec. 31, 2020

Related U.S. Application Data

(63) Continuation of application No. 16/397,595, filed on Apr. 29, 2019, now Pat. No. 10,778,335, which is a
(Continued)

(51) Int. Cl.
*H04B 10/2575* (2013.01)
*H03F 1/32* (2006.01)
(Continued)

(52) U.S. Cl.
CPC ......... *H04B 10/25753* (2013.01); *H03F 1/32* (2013.01); *H03F 3/245* (2013.01); *H04B 1/0475* (2013.01); *H04B 10/40* (2013.01); *H04B 10/58* (2013.01); *H03F 2200/411* (2013.01); *H03F 2200/451* (2013.01); *H03F 2201/3215* (2013.01); *H04B 2001/0416* (2013.01); *H04B 2210/006* (2013.01)

(58) Field of Classification Search
None
See application file for complete search history.

(56) References Cited

U.S. PATENT DOCUMENTS

| | | |
|---|---|---|
| 4,628,278 A | 12/1986 | Bottman |
| 7,138,873 B2 | 11/2006 | Chandra et al. |

(Continued)

FOREIGN PATENT DOCUMENTS

| | | |
|---|---|---|
| EP | 0168123 A1 | 1/1986 |
| EP | 3404829 A1 | 11/2018 |

OTHER PUBLICATIONS

Combined Search and Examination Report for GB2006262.6 dated Oct. 21, 2020.

*Primary Examiner* — Darren E Wolf
(74) *Attorney, Agent, or Firm* — Brian T. Sattizahn; Maynard Cooper & Gale, P.C.

(57) ABSTRACT

A system has a plurality of non-linear circuit stages and an intervening linear circuit stage. An input signal is provided to a first non-linear circuit stage, and from the first non-linear circuit stage, to the linear circuit stage. The first non-linear circuit stage applies a second-order distortion to the input signal and provides the resulting signal to the linear circuit stage. The resulting signal that is output from the linear circuit stage is inverted with respect to the input signal and suitably linearly processed (attenuated or amplified). This signal is then provided to a second non-linear circuit that applies a second-order distortion and outputs a signal that has an overall reduction in second-order distortion.

19 Claims, 8 Drawing Sheets

Related U.S. Application Data continuation-in-part of application No. 15/597,937, filed on May 17, 2017, now Pat. No. 10,277,172.

(51) Int. Cl.
    *H04B 10/58*     (2013.01)
    *H04B 10/40*     (2013.01)
    *H04B 1/04*     (2006.01)
    *H03F 3/24*     (2006.01)

(56) References Cited

U.S. PATENT DOCUMENTS

| | | |
|---|---|---|
| 7,142,137 B2 | 11/2006 | Batruni |
| 7,372,966 B2 | 5/2008 | Bright |
| 8,547,172 B1 | 10/2013 | Schemmann |
| 10,277,172 B2 | 4/2019 | Prentice et al. |
| 2006/0197577 A1 | 9/2006 | Mukherjee |
| 2008/0231370 A1 | 9/2008 | Bretchko et al. |
| 2011/0095819 A1 | 4/2011 | Velazquez |
| 2014/0273889 A1 | 9/2014 | Manku |
| 2014/0292406 A1 | 10/2014 | Dechen |
| 2018/0337641 A1* | 11/2018 | Prentice .................. H03G 3/20 |
| 2019/0253145 A1 | 8/2019 | Prentice et al. |

\* cited by examiner

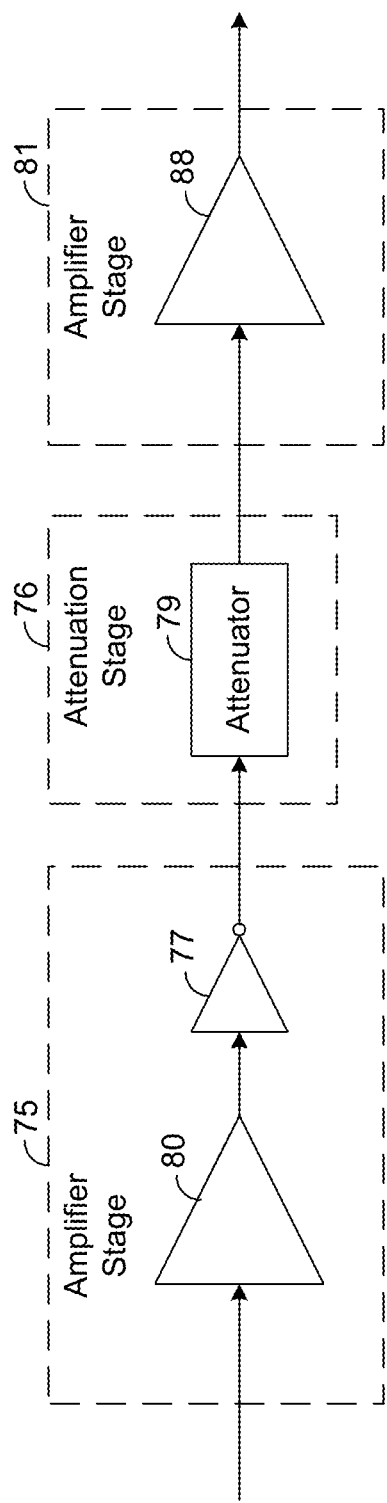
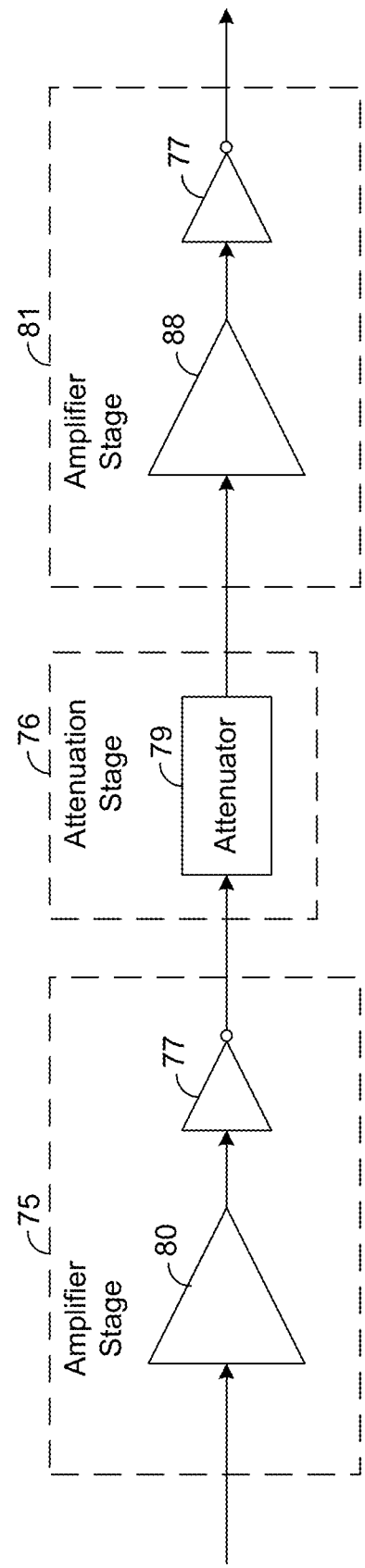
FIG. 3A
FIG. 3B

REDUCTION OF SECOND-ORDER NON-LINEAR DISTORTION IN A WIDEBAND COMMUNICATION SYSTEM

CROSS-REFERENCE TO RELATED APPLICATIONS

This application is a continuation of U.S. application Ser. No. 16/397,595 filed on Apr. 29, 2019, entitled "REDUCTION OF SECOND-ORDER NON-LINEAR DISTORTION IN A WIDEBAND COMMUNICATION SYSTEM," which is a continuation-in-part of U.S. application Ser. No. 15/597,937 filed on May 17, 2017, entitled "REDUCTION OF SECOND-ORDER NON-LINEAR DISTORTION IN A WIDEBAND COMMUNICATION SYSTEM," which applications are incorporated herein by reference.

BACKGROUND

Radio frequency (RF) amplifiers are used in a variety of conventional applications. As an example, RF amplifiers are frequently used in data communications in order to increase the range or signal quality of data signals communicated through a network. Ideally, a RF amplifier is linear such that its output signal varies proportionally to its input signal. However, in reality, the transfer function of all RF amplifiers contains some non-linear terms, and these introduce some harmonic or intermodulation distortion in the output signal. In a narrow-band communication system, second order distortion falls outside the frequency band of interest, and can be removed by filtering. However, filtering is inappropriate where the instantaneous bandwidth is greater than an octave such that the second order harmonics or intermodulation products fall in band.

One solution that has been used to reduce second order harmonic distortion in wideband systems involves the use of multiple amplifiers arranged in a parallel, balanced or anti-phase configuration such that asymmetrical distortion in each amplifier produces symmetrical distortion in the output signal, thereby cancelling the effects of second order harmonics. However, the use of a parallel path for amplifiers is not always possible or convenient, and techniques for reducing second order distortion in the output of an amplifier without requiring an additional amplifier in a parallel, anti-phase arrangement are generally desired.

BRIEF DESCRIPTION OF THE DRAWINGS

The above and other features of the present, its nature and various advantages will be more apparent upon consideration of the following detailed description, taken in conjunction with the accompanying drawings in which:

FIGS. 3A and 3B depict illustrative schematic diagrams for circuits for applying a gain and removing second order distortion in accordance with some embodiments of the present disclosure.

DETAILED DESCRIPTION

Figure 1A:
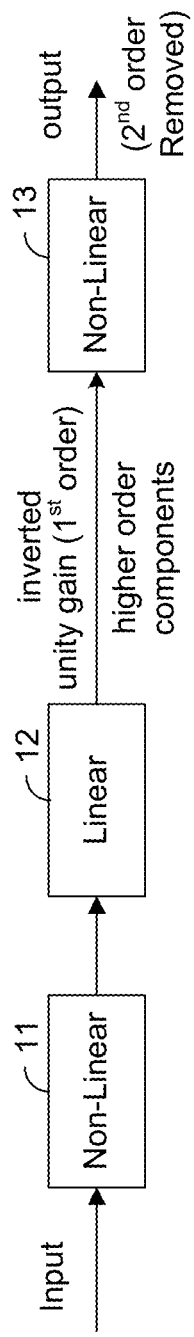
FIG. 1A depicts an illustrative functional diagram of linear and non-linear circuit stages for removal of second order distortion in accordance with some embodiments of the present disclosure.

The present disclosure generally pertains to systems and methods for reducing second order non-linear distortion in electronic circuits such as gain circuits (e.g., amplifiers or other circuits that apply a non-linear transfer function including a second-order term to an input signal). In one embodiment, a system includes a plurality of circuit stages (e.g., one or more circuit elements that process an incoming signal) that process a signal, for example, to apply an overall gain to the signal. In an embodiment, some of the circuit stages are non-linear circuit stages (e.g., they have a non-linear transfer function including a second order term) and other circuit stages are substantially linear (e.g., they apply a proportional, also known as "first order", modification to an input signal). In some applications, it may be necessary to use components that apply non-linear processing to an input signal, while nonetheless limiting certain types of non-linear distortion. For example, in certain systems harmonics may interfere with other signals of interest, but a non-linear component that creates such harmonics (e.g., an amplifier) may nonetheless be desirable for a particular application (e.g., due to power consumption, size, cost, etc.).

As described herein, the various circuit stages may be configured and coupled such that desired processing is performed while substantially eliminating undesired second-order-distortion. In an embodiment, a first non-linear circuit stage, a linear circuit stage, and a second non-linear circuit stage may be coupled in series. The first non-linear circuit stage may receive an input signal, process the signal in a manner that adds a non-linear component to the input signal (e.g., second order processing that results in a plurality of additional second order signal components) and output the processed signal to the linear circuit stage. The linear circuit stage may process the received signal in a linear manner (e.g., first order processing) and provide its output signal to the second non-linear circuit stage. The collective processing of the first non-linear circuit stage and the linear circuit stage may result in the output signal from the linear circuit stage having a substantially unity gain and being inverted when compared to the input signal to the first non-linear circuit stage. This output signal from the linear circuit stage is provided to the second non-linear circuit stage, which has at least some substantially similar characteristics (e.g., second order distortion) to the first non-linear circuit stage.

In an embodiment, both of the non-linear circuit stages are identical gain stages, e.g., having substantially identical components and functionality such that a gain is applied to an incoming signal to each of the non-linear circuit stages in a substantially identical manner (e.g., an identical first order gain and second order distortion are applied by each of the non-linear circuit stages). In order to maintain the substantial unity gain of the first non-linear circuit stage and linear circuit stage, the linear circuit stage may be an attenuation stage that attenuates the first order components of the signal that is output from the first non-linear circuit stage in accordance with the gain of the first non-linear circuit stage, resulting in an overall unity gain. The inversion of the first non-linear circuit stage and the linear circuit stage may occur at a variety of points within the series circuit between the output of the first non-linear circuit stage and the input of the second non-linear circuit stage. The gain applied by the second non-linear circuit stage may result in an overall first order gain applied as compared to the input signal. Undesired second order components may be substantially eliminated from the signal that is output from the second non-linear circuit stage, as described herein.

In an embodiment, a first gain stage may be a first non-linear amplifier that provides a gain (e.g., at least a first and second order transfer function) to the signal. The output signal from the amplifier may be passed through an inverter and a linear attenuator that provides a cumulative loss (first order negative gain) that is substantially similar to the first order gain applied by the first amplifier. For example, the attenuator may have a loss that is the same as the gain of the first amplifier. The resulting signal that is output from the attenuator may be inverted and have a unity gain with respect to the input signal to the amplifier. The amplifier may also add some second and higher order components to the input signal that are not removed by the linear attenuator. The signal output from the attenuator may be provided to a second gain stage which may be a second non-linear amplifier that provides a gain (e.g., at least a first and second order transfer function) to the signal. Although the second amplifier may apply a second order distortion to the signal, the second order components of the output signal may be substantially cancelled, based on the inversion and second order components of the first amplifier, attenuator, and inverter. The resulting signal may have the desired first order gain with second order distortion substantially removed from the signal.

FIG. 1A depicts an illustrative functional diagram of linear and non-linear circuit stages for removal of second order distortion in accordance with some embodiments of the present disclosure. Although particular functional blocks are depicted as being configured in a particular manner in FIG. 1A, in an embodiment the circuitry of FIG. 1A may include a first non-linear circuit stage 11 in series with a linear circuit stage 12 and a second non-linear circuit stage 13.

A non-linear circuit stage 11 may include one or more suitable circuit elements that modify an input signal to the non-linear circuit stage in a non-linear manner, e.g., by applying second, third, and/or higher order modifications to the incoming signal. The non-linear circuit stage 11 may also modify the incoming signal in a linear manner. Components of a non-linear circuit stage may include components such as amplifiers, electrical-to-optical and optical-to-electrical converters, etc. In addition, linear components that modify an input signal in a manner that is substantially first order only (e.g., inverters, baluns, transformers, matching components, attenuators etc.) may be included within the non-linear circuit stage 11 as long as the output signal has also been modified in a non-linear manner within the non-linear circuit stage 11.

A linear circuit stage 12 may be connected in series with the non-linear circuit stage 11 (e.g., either directly connected or including one or more intervening circuit elements) to receive the signal that is output from the non-linear circuit stage 11, or in some embodiments, a signal that is substantially similar to this output signal (e.g., based on one or more intervening circuit elements). In an embodiment, the non-linear circuit stage may include one or more suitable circuit elements that modify an input signal in a manner that is substantially first order only. For example, the linear circuit stage 12 may include one or more components such as inverters, baluns, transformers, matching components, attenuators, etc. When combined with the processing of the non-linear circuit stage 11, the output signal from the linear circuit stage 12 may be inverted with respect to the input signal to the linear circuit stage 12. Moreover, when combined with the processing of the non-linear circuit stage 11, the output signal from the linear circuit stage 12 may have an overall gain or loss such that that the overall objective of substantially symmetrical waveform distortion is achieved from the entire signal chain including non-linear circuit stage 13. Based on the non-linear circuit stage 11, the signal that is output from the linear circuit stage 12 may also include the non-linear signal components that were introduced at non-linear circuit stage 11, with the non-linear components being inverted with respect to the original non-linear circuit stage 11.

A non-linear circuit stage 13 may be connected in series with the non-linear circuit stage 11 and linear circuit stage (e.g., either directly connected or including one or more intervening circuit elements) to receive the signal that is output from the linear circuit stage 12, or in some embodiments, a signal that is substantially similar to this output signal (e.g., based on one or more intervening circuit elements). Non-linear circuit stage 13 may include one or more similar non-linear circuit elements that are found in non-linear circuit stage 11. The non-linear circuit stage 13 may also modify the incoming signal in a linear manner.

In an embodiment, the non-linear circuit stage 13 may include substantially similar processing to non-linear circuit stage 11 (e.g., based on identical or functionally similar components) such that first order gain and higher order distortion of the non-linear circuit stage 11 and non-linear circuit stage 13 are substantially identical. As a result of the combined processing of the non-linear circuit stage 11, linear circuit stage 12, and non-linear circuit stage 13, the output signal may undergo desired processing (e.g., applying a gain by an amplifier that introduces second order distortion) while the output signal is substantially free of second order distortion components.

Figure 1B:
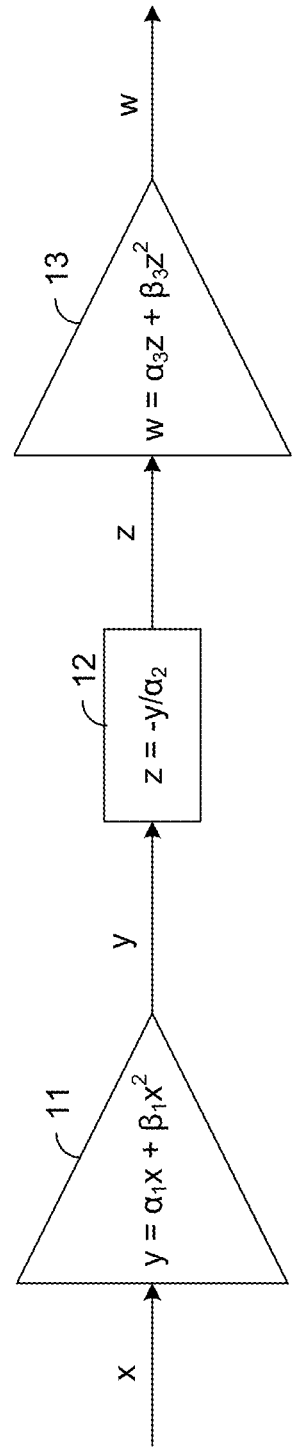
FIG. 1B depicts an illustrative functional diagram of linear and non-linear circuit stages disclosure for removal of second order distortion in accordance with some embodiments of the present disclosure.

FIG. 1B depicts an illustrative functional diagram of linear and non-linear circuit stages for removal of second order distortion in accordance with some embodiments of the present disclosure. FIG. 1B depicts a first non-linear circuit stage 11, a linear circuit stage 12, and a non-linear circuit stage 13. In an embodiment, each of the non-linear circuit stages may be gain (or amplifier) stages (e.g., active gain stages or passive stages) and the linear circuit stage may be an attenuation stage, although similar processing may be performed in different embodiments using inverting amplifiers or electro-optical transducers, etc. In one embodiment, each of the non-linear circuit stages 11 and 13 may be substantially similar, e.g., may have identical or functionally similar components that apply substantially identical first order and higher order transfer functions (e.g., first order gain and second order distortion) to an input signal. Linear circuit stage 12 may be inverting and may apply a first order attenuation that is substantially identical to the first order gain of the non-linear circuit stages 11 and 13, such that an overall first order gain or loss from the first non-linear circuit stage 11 and the linear circuit stage 12 is a substantially unity gain. However, in other embodiments, the non-linear circuit stages 11 and 13 may be substantially different, e.g., may have different components that apply different first order and higher order transfer functions (e.g., first order gain and second order distortion) to an input signal.

In an embodiment, the output (y) of the non-linear circuit stage 11 can be expressed in terms of the stage's input (x) according to the following equation, assuming that the signal is distorted by (or the gain applied to the signal contains) only second order harmonic distortion (i.e., neglecting higher-order distortion that may be present), with $\alpha_1$ representing a first order gain and $\beta_1$ representing a second order gain:

$$y = \alpha_1 x + \beta_1 x^2 \qquad (1)$$

This signal is provided to the linear circuit stage 12. If it is assumed that the linear circuit (or attenuation) stage 12 is linear, that the attenuation factor is $1/\alpha_2$, and that the linear circuit (or attenuation) stage 12 inverts the received signal y, then the output (z) from the linear circuit stage 12 (or the input (z) to the non-linear circuit (or amplifier) stage 13) can be expressed as follows:

$$z = -y/\alpha_2 \qquad (2)$$

This output signal (z) is provided to the non-linear circuit stage 13. If the non-linear circuit (or amplifier) stage 13 has a first order gain $\alpha_3$ and second order gain $\beta_3$ the output (w) of the non-linear circuit (or amplifier) stage 13 can be expressed in terms of its input (z) from linear circuit (or attenuation) stage 12 according to the following equation.

$$w = \alpha_3 z + \beta_3 z^2 \qquad (3)$$

Substituting Equation (1) into Equation (2) yields the following equation for the output of the linear circuit stage 12:

$$z = -(\alpha_1 x + \beta_1 x^2)/\alpha_2 \qquad (4)$$

In an alternate embodiment, where $\alpha_1 = \alpha_2 = \alpha_3 = \alpha$ and $\beta_1 = \beta_3 = \beta$, substituting Equation (1) into Equation (2) yields the following equation for the output of the linear circuit stage 12:

$$z = -x - (\beta/\alpha)x^2 \qquad (4A)$$

Then, substituting Equation (4) into Equation (3) yields the following equation for the output of the non-linear circuit stage 13

$$w = -\alpha_3(\alpha_1 x + \beta_1 x^2)/\alpha_2 + \beta_3(\alpha_1 x + \beta_1 x^2)^2/\alpha_2 \qquad (5)$$

In the alternate embodiment, where $\alpha_1 = \alpha_2 = \alpha_3 = \alpha$ and $\beta_1 = \beta_3 = \beta$, substituting Equation (4A) into Equation (3) yields the following equation for the output of the non-linear circuit stage 13

$$w = \alpha(-x - (\beta/\alpha)x^2) + \beta(-x - (\beta/\alpha)x^2)^2 \qquad (5A)$$

Equation (5) simplifies to the following Equation (6):

$$w = -\alpha_3 \alpha_1 x/\alpha_2 - \alpha_3 \beta_1 x^2/\alpha_2 + \beta_3 \alpha_1^2 x^2/\alpha_2^2 + \beta_3 \beta_1^2 x^4/\alpha_2^2 + 2\alpha_1 \beta_3 \beta_1 x^3/\alpha_2^2 \qquad (6)$$

It is possible to cause the second-order term to cancel in Equation (6) if the following condition is true:

$$-\alpha_3 \beta_1/\alpha_2 + \beta_3 \alpha_1^2/\alpha_2^2 = 0 \qquad (7)$$

This can be rearranged as shown:

$$\beta_3/\alpha_3 * \alpha_1/\alpha_2 = \beta_1/\alpha_1 \qquad (8)$$

In the alternate embodiment, where $\alpha_1 = \alpha_2 = \alpha_3 = \alpha$ and $\beta_1 = \beta_3 = \beta$, Equation (5A) simplifies to the following Equation (6A), in which the second order terms cancel at the output of the non-linear circuit stage 13:

$$w = -\alpha x + (2\beta^2/\alpha)x^3 + (\beta^3/\alpha^2)x^4 \qquad (6A)$$

One configuration of the alternate embodiment that results in $\beta_1 = \beta_3$ and $\alpha_1 = \alpha_2 = \alpha_3$ is when the two amplifier stages are identical and the attenuation has the same loss (in dB) as the linear gain of either amplifier (in dB). In this configuration, the chain of stages 11-13 is "linearized" with respect to the second order non-linearity. The chain of stages 11-13 may exhibit higher order (e.g., third and fourth order) intermodulation products, but not second order intermodulation products.

More generally, referring back to the discussion of Equations 5-8, the fraction $\beta/\alpha$ can be thought of as being the second-order distortion relative to the linear gain of the amplifier stage, referred to its output. If the amplifiers have identical relative characteristics, where $\beta_3/\alpha_3 = \beta_1/\alpha_1$, it follows that cancellation will still occur when $\alpha_1 = \alpha_2$ even when $\alpha_1 \neq \alpha_3$. For example, a high-gain input stage and a lower-gain output stage can still be arranged to achieve second-order cancellation, provided that they distort in the same way.

In the extreme case where the two amplifiers are completely different, such that $\beta_3/\alpha_3 \neq \beta_1/\alpha_1$, second-order cancellation can still be achieved by selecting the correct value of $\alpha_2$:

$$\alpha_2 = \beta_3 \alpha_1^2 / (\beta_1 \alpha_3) \qquad (9)$$

The inter-stage attenuation, characterized by equation (2), is assumed to contain a signal inversion. It is clear from equation (9) that an equivalent outcome would be achieved if any of $\beta_3$, $\beta_1$, or $\alpha_3$ contained an inversion instead. This may be conveniently achieved in some embodiments through appropriately-connected differential devices or components.

Figure 2A:
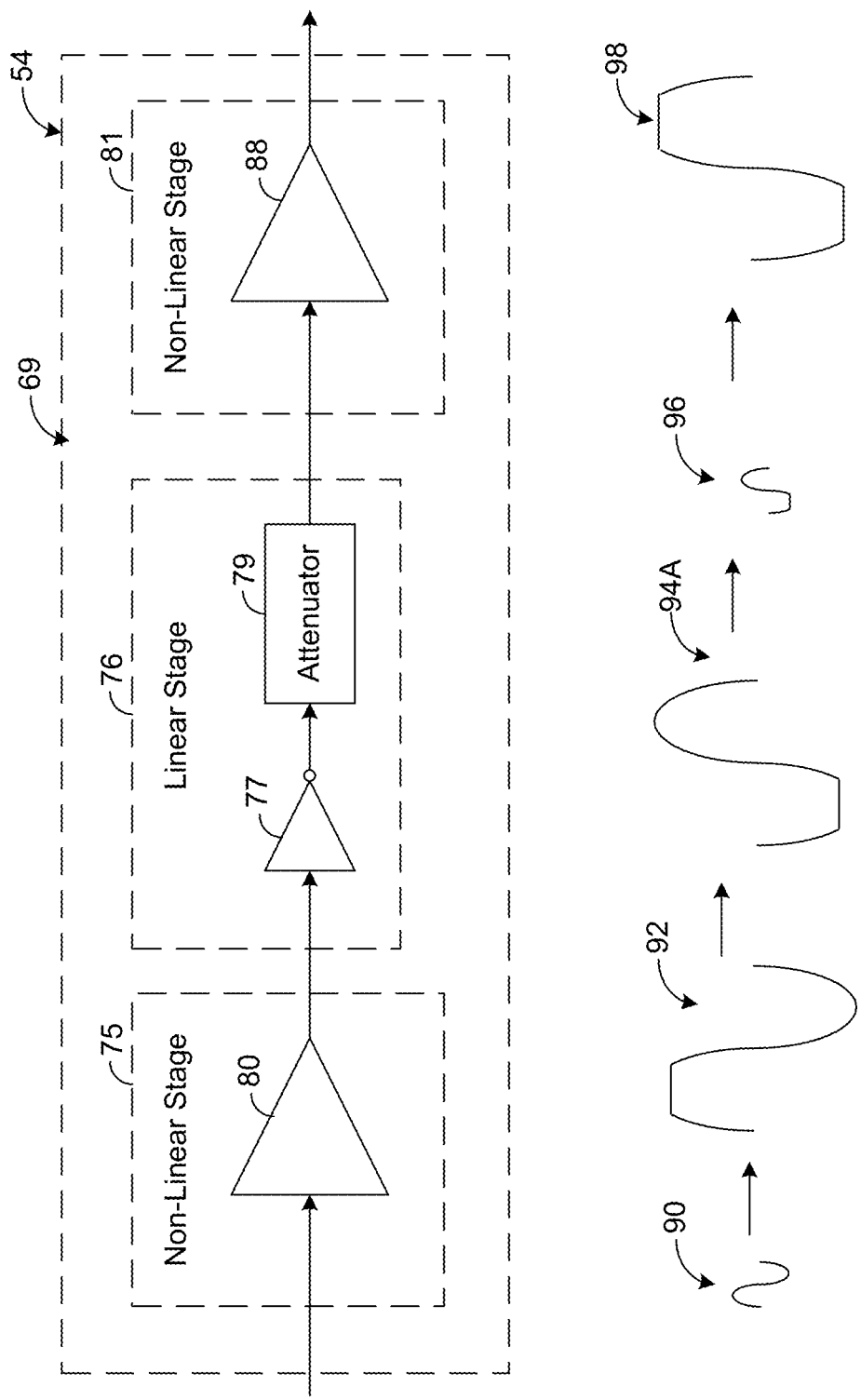
FIGS. 2A and 2B depict illustrative schematic diagrams and associated signals for systems for removal of second order distortion in accordance with some embodiments of the present disclosure.
Figure 2B:
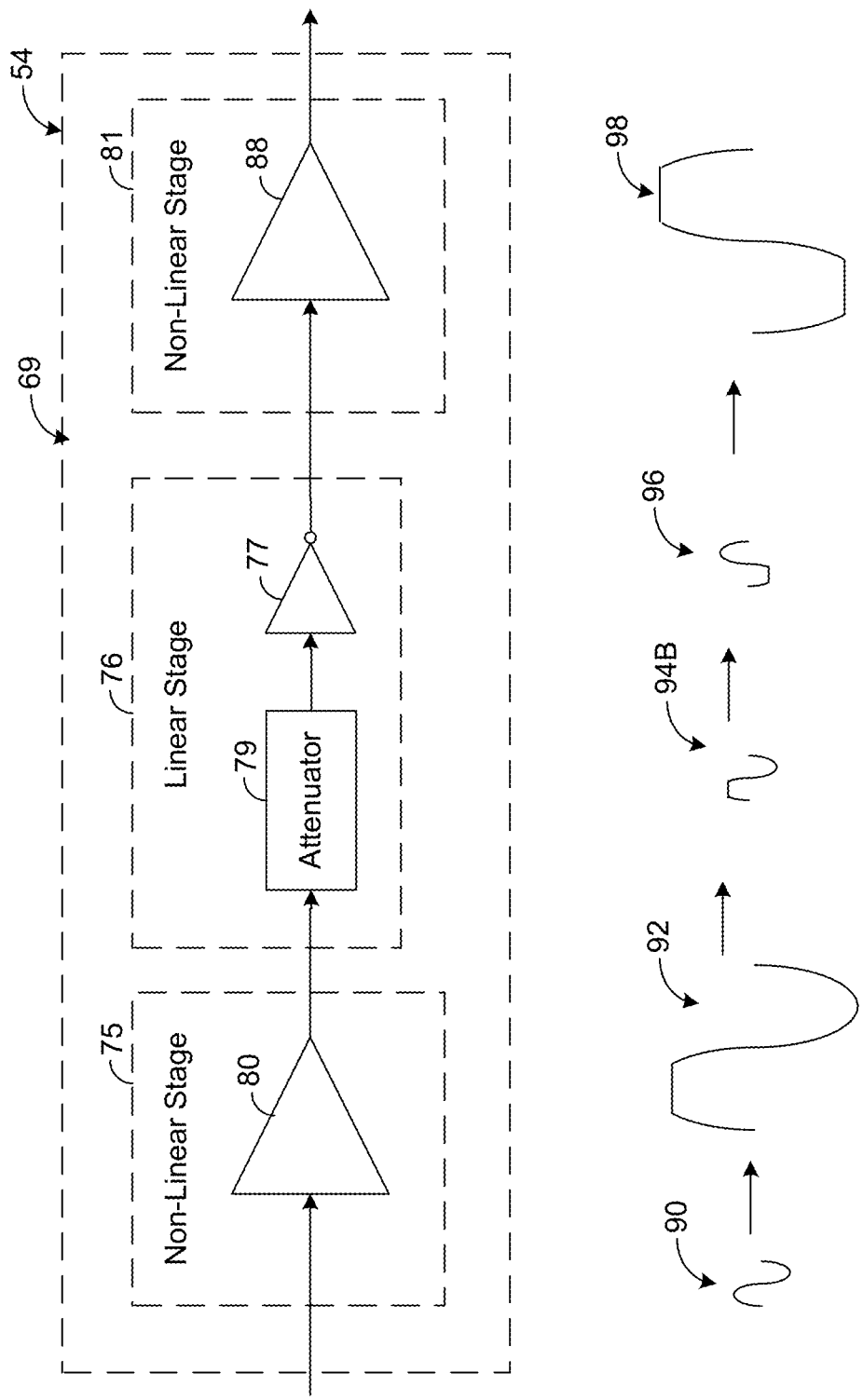

FIGS. 2A and 2B depict illustrative schematic diagrams and associated signals for systems for removal of second order distortion in accordance with some embodiments of the present disclosure. In the embodiment of FIGS. 2A and 2B, an overall RF gain stage 54 includes a non-linear circuit stage 11 that is implemented as a gain stage 75, a linear circuit stage 12 that is implemented as an attenuation stage 76, and a non-linear circuit stage 13 that is implemented as a gain stage 81. The gain stage 75, attenuation stage 76, and gain stage 81 are all coupled in series.

In an embodiment, the gain stage 75 has at least one amplifier 80 (e.g., RF power amplifier) that is configured to receive and apply a gain to an electrical signal. Note that the gain stage 75 may have any number of components (e.g., amplifiers, optical converters, etc.) that are arranged to provide a desired gain (G) to the signal received by the gain stage 54. As an example, the gain stage 75 may have a plurality of amplifiers 80 connected in series such that each amplifier 80 provides an incremental gain to the received signal in order to achieve an overall desired first order gain (G). The amplifier(s) may also modify the input signal in a non-linear manner, for example, by providing a second order distortion to the input signal. In other embodiments, the gain stage 75 may have other arrangements.

The attenuation stage 76 is coupled to the gain stage 75 and is configured to attenuate the signal output by the gain stage 75. In some embodiments, the attenuation stage 76 substantially removes the gain applied to the signal by the gain stage 75 (e.g., based on a first order loss of attenuation stage 76 that is substantially identical to the first order gain of the gain stage 75). The attenuation stage 76 may be implemented with any suitable device or devices that apply attenuation (loss) to the gain stage 75 output signal in a manner that is substantially similar to the gain applied by the gain stage 75. Examples include an attenuator (e.g., attenuator 79), coaxial cable runs, one or more laser devices of electrical-to-optical or optical electrical converters, optical fiber runs, etc. The attenuation stage 76 may also be configured to perform other processing on the signal as may be desired. As an example, the attenuation stage 76 may perform inversion of a signal as described herein with regard to FIGS. 2A and 2B, such that the output of the attenuation stage 76 is inverted with respect to the incoming signal. The inversion may be implemented with any suitable component or components that output a signal having substantially identical amplitude and opposite phase from the input signal, such as inverter 77, transformers, or crossover of differential connections. In other embodiments, the attenuation stage 76 may provide other types of functions.

The attenuator 79 is configured to attenuate the signal output by the gain stage 75 before such signal reaches the gain stage 81. In some embodiments, the attenuator 79 attenuates the signal by substantially the same amount that the gain stage 75 amplifies the signal. That is, the attenuator 79 substantially removes the first order gain (G) provided by the gain stage 75. Thus, in some embodiments, the signal level input to the gain stage 81 is substantially similar to the signal level input to the gain stage 75, with the signal inverted based on the operations performed at gain stage 75 and inverter 77, and including a higher order component or components based on the non-linear processing of gain stage 75.

The gain stage 81 has at least one amplifier 80 that is configured to receive and apply a gain to the electrical signal received by the gain stage 81. In an embodiment, the gain stage 81 may provide substantially identical processing as the gain stage 75 (e.g., based on identical or functionally similar components). Note that the gain stage 81 may have any number of amplifiers that are arranged to provide a first order gain (G) to the signal as well as higher order gains. As an example, the gain stage 81 may have a plurality of amplifiers 88 (e.g., RF power amplifiers) connected in series such that each amplifier 88 provides an incremental gain to the received signal in order to achieve an overall desired gain characteristics. In other embodiments, the gain stage 88 may have other arrangements. As an example, each gain stage 75 and 81 may have a single respective amplifier.

In an embodiment, the characteristics of the gain stage 81 are substantially similar to the characteristics of the gain stage 75 such that the gain stage 81 provides substantially the same first order gain (G) and higher order gain(s) as the gain stage 75. In some embodiments, the same type (e.g., same model number) of amplifier or amplifiers are used to implement both gain stages 75 and 81. Thus, like the gain stage 75, the gain stage 81 applies a gain (G) to its input signal such that the output signal has a greater amplitude relative to the input signal to the stage. However, the signal that is input to the second gain stage 81 is inverted with respect to the original signal input to gain stage 75, and includes inverted higher order (e.g., second order) components based on the second order processing of gain stage 75. As a result, second order components may be substantially cancelled from the output signal of non-linear circuit stage 81. In some embodiments, other higher order signal components (e.g., third and fourth order signal components) may remain in the signal in whole or in part (e.g., based on the components being substantially reduced in amplitude or based on those components not interfering with relevant frequency bands).

FIGS. 2A and 2B also depict a portion of an input signal being processed by the gain stage 75, attenuation stage 76, and gain stage 81. The relative location of each of the signal portions corresponds to an input or output signal of a circuit element of the embodiments of FIGS. 2A and 2B. An input signal 90 has relative amplitude and is depicted as an input sinusoid, although it will be recognized that a signal having any suitable waveform may be provided to the gain stage 75. The output of gain stage 75 may correspond to signal 92. In the depictions of FIGS. 2A and 2B, a gain has been applied to the input signal 90. Moreover, in a simplified depiction the signal is depicted as undergoing a "clipping" based on the specifications of the amplifier 80 of the gain stage and the introduction of higher order (e.g., second order) signal components.

The output signal 92 may be provided to attenuation stage 76, which in the embodiment of FIGS. 2A and 2B, may include an inverter 77 and an attenuator 79. In the embodiment of FIG. 2A, the inverter 77 is configured to invert the signal output by the gain stage 75, with an output of inverter 77 depicted as signal 94A. FIG. 2A shows the output signal after it has been inverted by inverter 77, with a substantially identical peak-to-peak amplitude as signal 92. As shown by FIG. 2A, the signal 94A output by the inverter 77 has a clipped trough corresponding to the clipped peak of signal 92, and the signal 94A has a positive peak corresponding to the negative trough of signal 92. Note that the inverter 77 may be located in the circuit at any point between the gain stages 75 and 81, as described herein. Further, it is possible for the inverter 77 to be integrated into another device for performing another function. As an example, some amplifiers are designed to invert signals such that, if desired, a single electrical device could be used to implement an amplifier 80 and the inverter 77.

The signal 94A is provided from inverter 77 to attenuator 79. Attenuator 79 applies a first order loss to signal 94A that is substantially identical to the first order gain applied by amplifier 80. However, attenuator 79 does not apply significant higher order modifications to the signal 94A, such that while the peak-to-peak amplitude of the signal 96 is reduced with respect to the signal 94A, the waveform shape is substantially unchanged. The resulting signal 96 may have a peak-to-peak amplitude that is substantially unchanged with respect to the input signal 90, with inverted higher order signal modifications based on the operations of the amplifier 80 and inverter 77.

In the embodiment of FIG. 2B, the attenuator 79 is configured to apply a first order loss to signal 92 that is substantially identical to the first order gain applied by amplifier 80. However, attenuator 79 does not apply significant higher order modifications to the signal 92, such that while the peak-to-peak amplitude of the signal 94B is reduced with respect to the signal 92, the waveform shape is substantially unchanged. The resulting signal 94B may have a peak-to-peak amplitude that is substantially unchanged with respect to the input signal 90.

The inverter 77 is configured to invert the signal output by the attenuator 79, with an output of inverter 77 depicted as signal 96, with inverted higher order signal modifications based on the operations of the amplifier 80 and inverter 77. FIG. 2B shows the output signal after it has been inverted by inverter 77, with a substantially identical peak-to-peak amplitude as signal 90. As shown by FIG. 2B, the signal 96 output by the inverter 77 has a clipped trough corresponding to the clipped peak of signal 94B, and the signal 96 has a positive peak corresponding to the negative trough of signal 94B.

The signal 96 is provided from attenuator 79 (in the embodiment of FIG. 2A) or inverter 77 (in the embodiment of FIG. 2B) to gain stage 88. In the simplified case of FIGS. 2A and 2B, the non-linear amplifier 88 has the same non-linear asymmetrical characteristic of non-linear amplifier 80, e.g., by "clipping" the positive level of the output signal when the positive level of the input signal reaches a specific amplitude. In the depicted embodiment, the positive peak of the input signal to non-linear amplifier 88 is clipped in the same manner and level as the positive peak of the input signal to non-linear amplifier 80. The resulting output signal from non-linear amplifier 88 has a positive clipped shape while leaving the negative trough substantially unchanged. In an embodiment, the first order and higher order gains applied by non-linear amplifier 88 may be substantially identical to those applied by non-linear amplifier 80. In the simplified depiction of the signal portions of FIGS. 2A and 2B, this may be depicted as an increase in the peak-to-peak amplitude of the input 96 as well as a substantially identical clipping of the signal at its peak, resulting in an output signal 98. The output signal 98 may have a desired overall first order gain (e.g., RF gain) applied to it while an undesired higher order signal portion (e.g., second order signal components) may be removed from the signal due to the recovered symmetrical shape.

The present disclosure has discussed non-linear and linear circuit stages, which may be embodied in a variety of different electrical and/or optical devices or components such as RF gain block amplifiers, semiconductor lasers and photodetectors. In an embodiment, the non-linear circuit stages may be gain stages embodied in RF amplifiers. RF amplifiers may include components such as Mini-Circuits GVA-81+, Qorvo ECG008, Analog Devices ADL5610 and may have first and second order gain characteristics such as 10 to 18 decibel (dB) first order gain and second order distortion in the range 40 to 55 dBm (OIP2). A linear circuit stage may include a RF inverter and a RF attenuator such as a Mini-Circuits TC1-1G2+ transformer and a Mini-Circuits LAT-12+ attenuator having a loss of 12 dB that substantially matches the gain of the RF amplifier.

Figure 6:
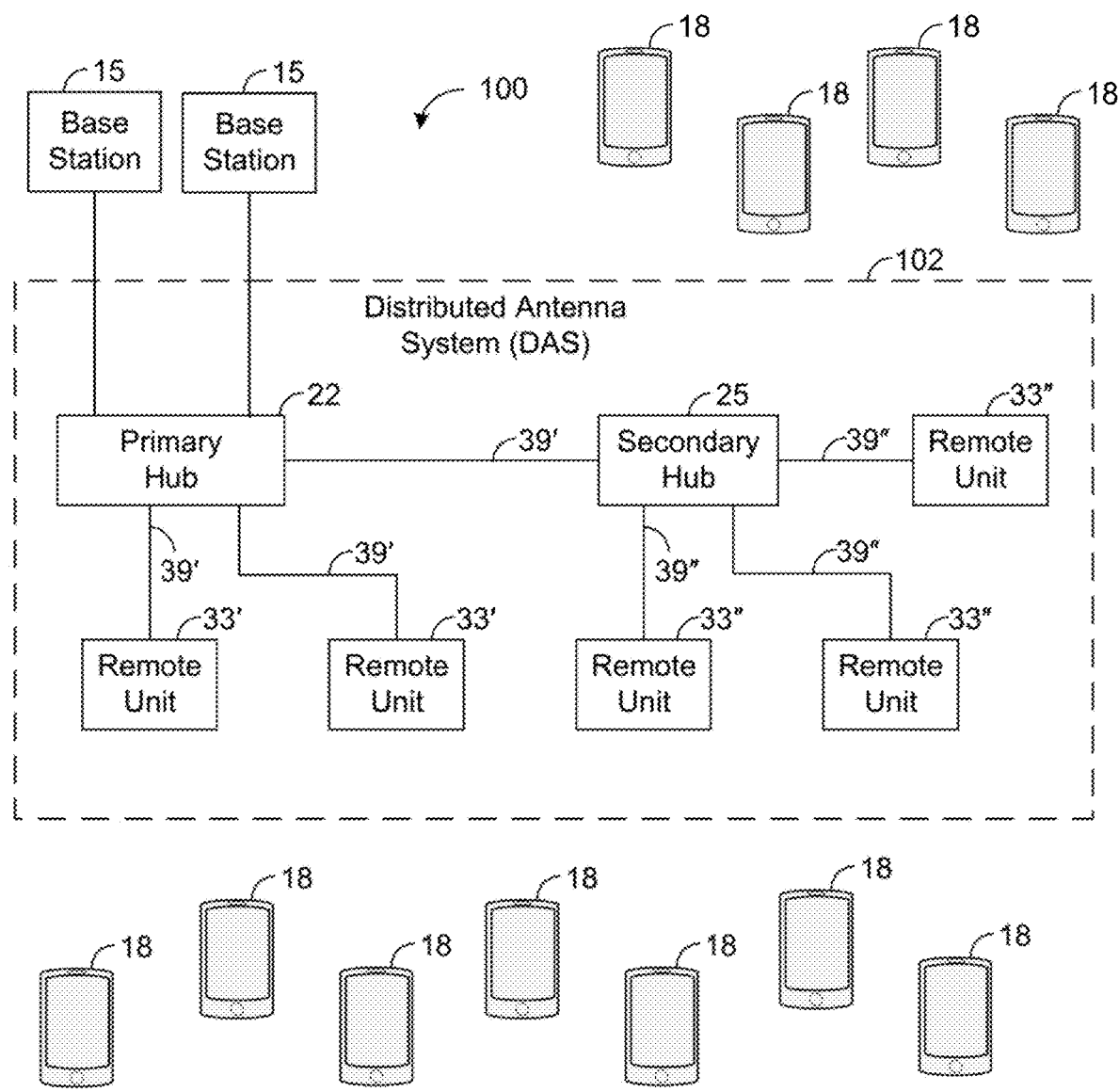
FIG. 6 depicts an illustrative block diagram of a communication system in accordance with some embodiments of the present disclosure.
Figure 7:
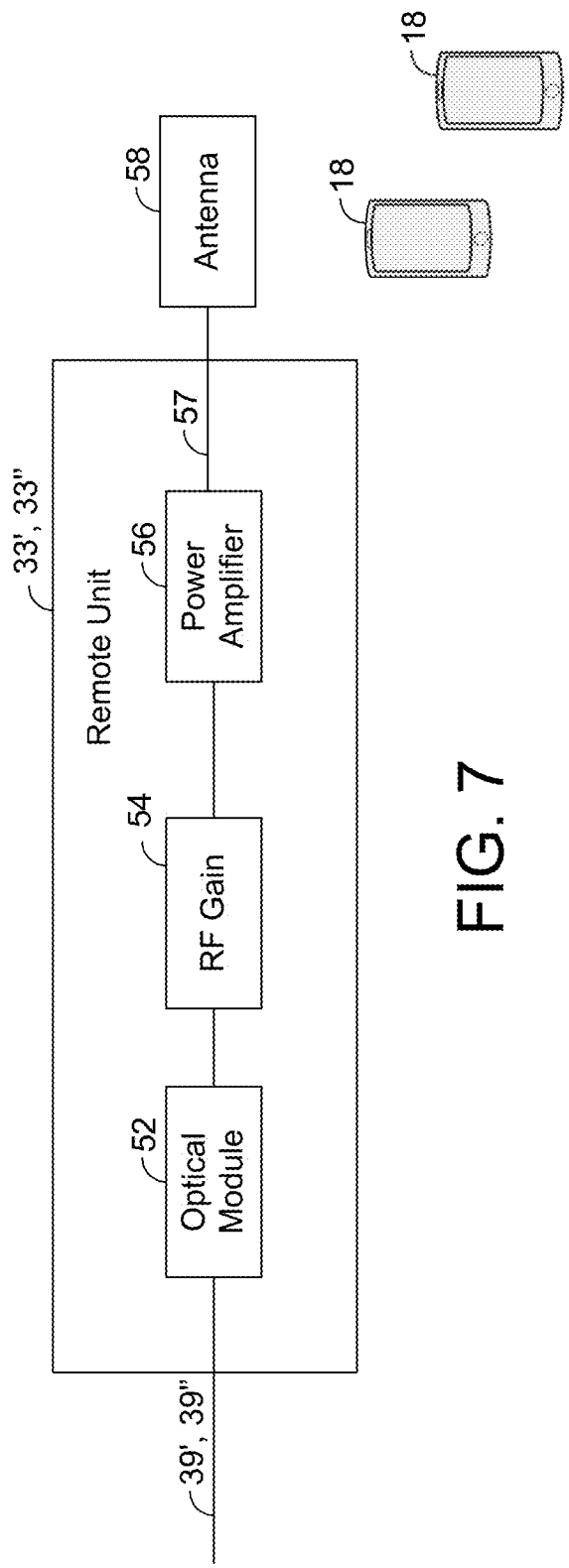
FIG. 7 depicts an illustrative block diagram of a remote unit of a distributed antenna system in accordance with some embodiments of the present disclosure.

While it will be understood that the non-linear and linear circuit stages may be configured in a variety of manners and may include a variety of components in accordance with the present disclosure, additional embodiments of RF circuitry including gain and attenuation stages are described with respect to FIGS. 6 and 7.

FIGS. 3A and 3B depict illustrative schematic diagrams for circuits for applying a gain and removing second order distortion in accordance with some embodiments of the present disclosure. In the embodiments of FIGS. 3A and 3B, the non-linear circuit stage 75 and the non-linear circuit stage 81 are gain stages that are implemented with RF amplifiers 80 and 88 and linear circuit stage 76 is an attenuation stage that is implemented with an RF attenuator 79. Collectively, these components may function as an RF amplifier having a desired first order gain and second order RF distortion substantially removed from the signal. However, it will be understood that similar functionality may be employed in applications other than RF, and for additional purposes other than applying a desired first order gain (e.g., to perform other processing with matched circuitry in a manner that reduces an undesired (e.g., second order) distortion in an output signal.

In the embodiments of FIGS. 3A and 3B, the amplifier stage 75 may be an inverting RF amplifier (as shown by amplifier 80 and inverter 77) having a first order gain and a second order distortion. An input signal may be amplified based on these gains and inverted, with the output signal being provided to the RF attenuator 79 of linear circuit stage 76. In an embodiment, the RF attenuator 79 may have a first order loss that is substantially equal to the first order gain of the RF amplifier 80, such that the output signal from the RF attenuator 79 has a substantially unity gain of first order signal components with respect to the input signal to RF amplifier 80. The resulting signal that is output from the RF attenuator 79 may thus be inverted with respect to the input signal to RF amplifier 80 and may also have second order distortion as a result of the processing of RF amplifier 80.

The output signal from attenuator 79 may be provided to the RF amplifier 88 of non-linear circuit stage 81. The RF amplifier 88 may, in one embodiment, have a similar first order gain and second order distortion to the RF amplifier 80. However, in other embodiments, the RF amplifier 88 may have a different first order gain and second order distortion from the RF amplifier 80. In the embodiment of FIG. 3A, the non-linear circuit stage 81 may not be inverting, while in the embodiment of FIG. 3B, the non-linear circuit stage 81 may be configured as an inverting RF amplifier (with RF amplifier 88 and inverter 77). Accordingly, as described herein, the application of the gains of RF amplifier 88 to the output signal of attenuator 79 may result in an output signal from RF amplifier 88 that has the first order gain that is substantially equal to the first order gain of RF amplifier 88, but has second order gain distortion removed.

Note that circuits are generally designed to meet desired specifications within certain tolerances that can be selected based on various design constraints or factors. The term "substantially," when used to describe a criterion of a parameter herein, refers to the parameter being within 10% of the stated criterion. As an example, "substantially cancelling" second order harmonic distortions refers to reducing the second order harmonic distortion by at least 10 dB. It has been shown that use of the techniques described herein for amplifying signals can result in a reduction of 10 to 20 dB of second order distortion.

Referring to the embodiment of FIG. 2, the explanation of the present invention has been simplified by neglecting to discuss the time delay present in coaxial cables and optical fibers. Provided that any delay element preserves the phase relationship between the fundamental and second harmonic components in the frequency domain, the simplified explanation still holds true. For example, if the non-linear stages both clip the positive peaks of the waveform, it is not important whether they both clip the positive peaks at the same instant in time or not.

Figure 4:
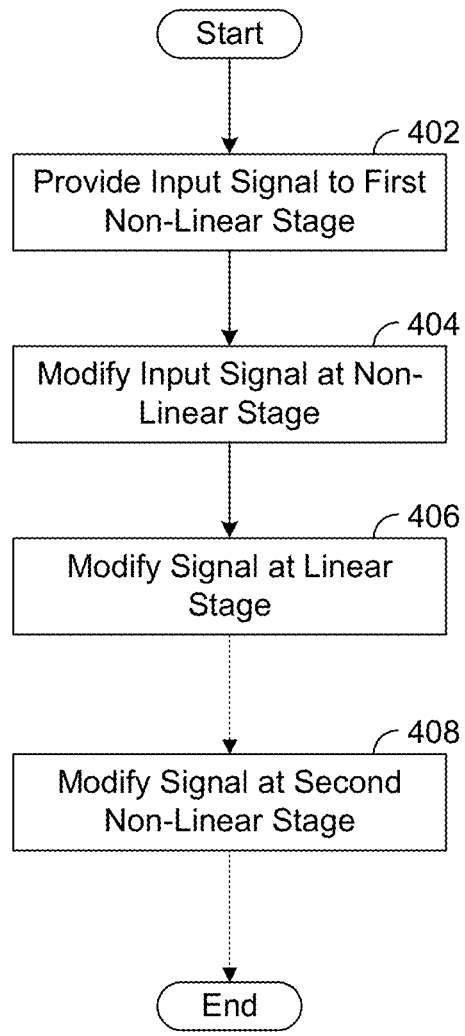
FIG. 4 depicts an illustrative flow chart for a method of removing second order distortion in accordance with some embodiments of the present disclosure.
Figure 5:
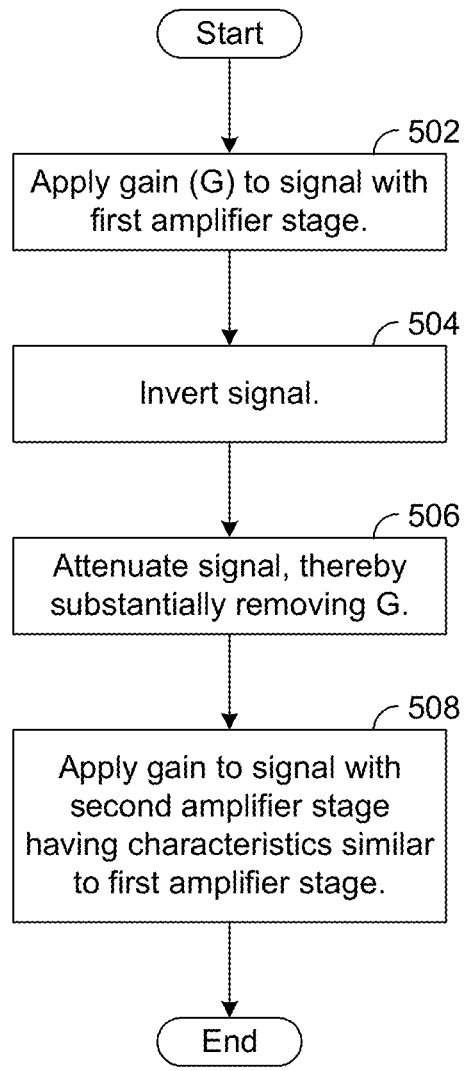
FIG. 5 depicts an illustrative flow chart for a method of removing second order distortion in accordance with some embodiments of the present disclosure.

Methods for utilizing the linear and non-linear circuit stages to apply desired processing while removing undesired higher order signal components from the output signal are depicted and described in FIGS. 4-5. Although a particular order or flow of steps is depicted in FIGS. 4-5, some operations may be performed in a different order, that additional steps may be added, or that one or more steps may be removed, as is describe herein or as may otherwise be understood by a person having ordinary skill in the art in view of the present disclosure.

FIG. 4 depicts an illustrative flow chart for a method of removing second order distortion in accordance with some embodiments of the present disclosure. In the embodiment of FIG. 4, series circuit stages may include a first non-linear circuit stage, a linear circuit stage, and a second non-linear circuit stage.

At step 402, an input signal may be provided to the first non-linear circuit stage. Processing may continue to step 404, at which the first non-linear circuit stage may modify the input signal, for example, by applying first order and higher order processing to the input signal. In some embodiments, the processing of the first non-linear circuit stage may invert the input signal. The resulting output signal may be provided to a linear circuit stage, and processing may continue to step 406.

At step 406, the linear circuit stage may process the signal that is received from the first non-linear circuit stage. In an embodiment, the linear circuit stage may perform complementary first order processing to the first non-linear circuit stage, such that the signal that is output from the linear circuit stage may have substantially identical first order characteristics to the signal that input to the first non-linear circuit stage. If the input signal to the first non-linear circuit stage was not inverted at that stage, an inversion may be performed at the linear circuit stage at step 406. The resulting signal may then be provided to the second non-linear circuit stage, and processing may then continue to step 408.

At step 408, the second non-linear circuit stage may process the received signal. Although processing may be performed in a variety of suitable manners, in an embodiment the second non-linear circuit stage may have substantially identical circuit characteristics (e.g., first order and higher order such as second order) as the first non-linear circuit stage. With respect to the original input signal to the first non-linear circuit element, a desired first order signal modification may be applied to input signal. The output signal may not include an undesired higher order signal component (e.g., second order signal component), which may be removed by the second non-linear circuit stage. Once the output signal with the desired first order signal modification has been processed and output by the second non-linear circuit stage, the processing of FIG. 4 may end.

FIG. 5 depicts an illustrative flow chart for a method of removing second order distortion in accordance with some embodiments of the present disclosure. In the embodiment of FIG. 5, the first non-linear circuit stage and second non-linear circuit stage may be identical RF gain stages implemented with amplifiers, while the linear circuit stage may include an inverter and RF attenuator, with the RF attenuator having a first order loss that is substantially complementary to the first order gain of the RF amplifier of the first non-linear circuit stage.

Processing starts at step 502 when a first gain stage 75 receives a signal that is to be amplified. As an example, the signal may be a wideband RF signal received from the base station 15 via one or more hubs 22 and 25 and optical fibers 39, as depicted in FIG. 6. As shown by block 502 of FIG. 5, the first gain stage 75 applies a gain (G) to the signal. In doing so, the first gain stage 75 may introduce non-linear distortion, including in particular second order harmonic distortion, while also clipping a portion of the RF signal. Processing may then continue to step 504.

As shown by block 504 of FIG. 5, the signal processed by the first gain stage 75 is inverted. Processing then continues to step 506, at which the signal is attenuated in order to substantially remove the first order gain (G) applied to the signal by the first gain stage 75. In another embodiment, the attenuation of the signal at step 506 may occur before the inversion of the signal in step 504. The resulting signal that is output from the attenuator is inverted with respect to the original input signal, has second order distortion based on the distortion from step 502, and has a substantially unity first order gain. The output signal from the attenuator is provided to an amplifier of the second gain stage 81, and processing then continues to step 508.

At step 508, a second gain stage 81 having characteristics (e.g., gain and saturation levels) similar to the first gain stage 75 amplifies the signal in order to apply the gain (G) removed by the attenuation in block. Since the gain stages 75 and 81 have similar characteristics, the stages 75 and 81 distort the signal similarly. However, since the signal is inverted at the input of the gain stage 81 relative to the input of the gain stage 75, the stages 75 and 81 distort the peaks and troughs symmetrically such that the second gain stage 81 substantially cancels the second order harmonic distortion introduced by the first gain stage 75 resulting in a signal at the output of the second gain stage 81 that is substantially free of second order harmonic distortion and is amplified with a first order gain (G) relative to the signal at the input of the first gain stage 75.

FIG. 6 depicts an embodiment of a communication system 100 having a distributed antenna system (DAS) 102 for wirelessly communicating signals between at least one base station (or network communication device) 15 (e.g., a RF source or a millimeter wave (mmwave) source) and numerous mobile communication devices 18. Such a system may be employed in a variety of applications, for example, where coverage by communication networks (e.g., cellular, WiFi, etc.) is limited or where a high density of communication devices 18 are typically used and employed, such as sporting venues, public squares, casinos, convention centers, hotels, and other similar venues. The DAS 102 of FIG. 6 has a hub 22, referred to herein as a "primary hub," that may be coupled to one or more base stations 15 by one or more electrical and/or optical connections communicating respective electrical and/or optical signals. The base stations 15 may function as a gateway to one or more existing communications systems, such as the different cellular phone networks of different carriers, the internet, fiber optic networks, etc.

In an embodiment, the DAS 102 may facilitate communications between a number of disparate networks that are accessible from base station 15 and the disparate mobile communication devices 18 that operate on those networks. Although DAS 102 may operate in a variety of manners (e.g., by providing a plurality of communication paths for different devices to communicate with different networks), in an embodiment as described herein the DAS 102 may function as a wideband DAS, that communicates RF signals between the base station 15 and the mobile communication devices 18 over a wide range of frequencies that are at least 1 octave apart, and in many embodiments, frequencies that are 1, 2, or greater orders of magnitude apart may be communicated, for example, in ranges such as 130 MHz to 2.7 GHz, 130 MHz to 3.5 GHz, and 150 MHz to 6 GHz (e.g., to accommodate any such signals in this range including the 5.9 GHz ISM band). In this manner, the DAS 102 may facilitate communications over multiple different communication and network protocols over a single DAS 102, with the underlying RF communication signals being communicated over shared communication mediums without modification. In an embodiment, DAS 102 may provide for end-to-end communications between the base station(s) 15 and the mobile communication devices, without performing any RF modulation of the disparate RF signals that are communicated over differing networks and via differing protocols. All communications may be routed through DAS 102 without RF modulation, for example, via fiber optic communication links that employ optical signal modulation between RF conversion stages, as described herein.

Returning to FIG. 6, the base station 15 may be coupled to a primary hub 22 of DAS 102. The primary hub 22 may be coupled to at least one other hub 25, referred to herein as a "secondary hub," and a plurality of remote units 33'.

Together, the primary hub and secondary hubs may form a star network, with the primary hub functioning as a primary node and the secondary hubs functioning as branch or peripheral nodes. Each remote unit provides for a communication endpoint with mobile devices, e.g., via RF transmissions through an antenna of the remote units. Each secondary hub may provide for connections to additional remote units (33" in FIG. 6) as well as additional secondary hubs. For simplicity of illustration, FIG. 6 shows a single secondary hub 25. However, the primary hub 22 may be interfaced with multiple secondary hubs 25, and a secondary hub 25 may be further interfaced with multiple additional secondary hubs 25 to form a DAS 102 of any desired size or scale (e.g., as a two-star distributed antenna system). The secondary hubs 25 may in turn be coupled to additional remote units 33", which allows DAS 102 to be employed over large physical areas and for scalability to dozens or even hundreds of remote units over unique physical environments.

In some embodiments, the primary hub 22 may be coupled to the secondary hub 25 and the remote units 33' by respective optical fibers 39, with optical fibers 39' corresponding to optical fiber connections between the primary hub and other devices (e.g., remote units 33' or secondary hubs 25). In an embodiment, each optical fiber 39 may include a plurality (e.g., two) of fiber connections to provide different physical fiber links for uplink and downlink communications over DAS 102. In other embodiments, connections to remote units 33 by a hub or secondary hub may be direct electrical connections, with optical connections only provided between hub devices. In other embodiments, other types of communication connections may be used. Indeed, it is possible for any component of the DAS 102 to communicate with any other component optically, electrically, or wirelessly. However the signals are communicated through the DAS 102, the underlying RF communication signal needs to be retained or reconstructed at both ends of the DAS 102, to enable communications with remote devices 18 and base station 15. Accordingly, as will be described in more detail hereafter, any of the components of the DAS 102, such as the primary hub 22, secondary hub 25, and remote units 33, may employ RF amplifiers that amplify signals for RF communications. As described herein, these amplifiers may be configured and coupled in a manner that reduces undesired signal characteristics such as linear distortions (e.g., second order linear distortion) on the output RF signal, which might otherwise occur during gain stages.

In the downstream direction, the primary hub 22 may receive electrical signals (e.g., multiple RF signals or other type of signal over a wideband) to be communicated to different ones of mobile communication devices 18 (e.g., to different subscribers to different cellular networks). In an embodiment, the primary hub 22 includes multiple service modules, processors, memories, and RF communication devices and switches that facilitate the combination of the incoming RF traffic into common RF data, e.g., to combine and balance the mix of cellular service signals and other RF signals into one wideband composite RF signal. The output RF data is provided to one or more optical modules of the hub, which modulate the RF signals for transmission as an optical signal over optical fibers 39'. In an embodiment, the modulation of the RF signals does not change the underlying RF signal, but instead, merely provides an optical carrier signal for the underlying RF signals without conversion into a digital signal. The resulting downstream optical signal is transmitted over the optical fibers 39' (e.g., over a downlink fiber of an optical fiber 39'). Although in an embodiment the same downlink signal may be transmitted over each of the optical fibers 39', in some embodiments different RF signals may be routed to different remote units 33' or secondary hubs 25 (e.g., based on knowledge and/or predictions regarding the locations of various mobile communication devices 18 relative to components of the DAS 102).

A remote unit 33' may receive the downlink signal (e.g., the optical signal including an optical carrier and the underlying RF signals) from the primary hub and output the underlying RF content received from the base station 15 to the mobile devices 18 via a local antenna of the remote device. In an embodiment, the received optical signal may be converted to the electrical domain, for example, by demodulating the optical carrier to output the underlying RF electrical content. However, while the underlying RF signal may maintain its underlying content (e.g., relative frequency, phase, amplitude, etc.), as a result of optical transmission and conversion the signal may need to be amplified prior to transmission to the mobile communication devices 18. As described herein, a RF gain stage may amplify the signal for transmission, in a manner that reduces the second order non-linear distortion that RF amplifiers often impart on the amplified signal. By reducing this second order non-linear distortion, this may provide for a transmitted signal from the remote unit 33' that is free of non-compliant spurious emissions created at the sum and difference frequencies of the individual RF carriers.

Each secondary hub 25 may include suitable processors, memory, hardware, and software to facilitate the distribution of the signals (e.g., optical signals carrying RF content) throughout the DAS 102. In an embodiment, the secondary hub may include a plurality of optical modules that transmit or receive optical signals, with the receiving optical modules converting the incoming optical signal into a RF signal and the transmitting optical modules converting RF signals into the outgoing optical signal. Internal processing of the RF signals by the secondary hub may in some instances require one or more gain stages. In other embodiments, the secondary hub 25 may route optical systems between various locations, without intermediate RF conversion within the secondary hub 25. In some embodiments, a secondary hub may perform some portion of functionality of a remote unit 33, for example, by providing for transmission of an RF signal from antennas coupled directly to secondary hub 25, or performing a conversion to RF signals and providing the electrical RF signal to a remote unit 33.

Note that the system 100 may have components, such as repeaters (not shown) or networks (not shown), through which signals may be communicated to extend the effective communication range between the DAS 102 and the mobile communication devices 18. In addition, if the DAS 102 has additional secondary hubs 25, the signal being communicated downstream may be similarly converted from the optical domain to the electrical domain at each secondary hub for wireless transmission of the signal by remote units 33 coupled to the respective secondary hub.

In the upstream direction, the mobile communication devices 18 may wirelessly transmit an electrical signal (e.g., RF signal) to be received by the base station 15. Such signals may be received by any of the remote units 33' or 33" based on the location of the mobile communication devices relative to the remote units 33' or 33". In an embodiment in which the remote units communicate with hubs via optical communications, a RF signal received by a remote unit 33" may be converted to the optical domain and transmitted to the secondary hub 25 via an uplink fiber of optical fibers 39"'. The optical fibers may then provide the optical signal to the primary hub 22 via an uplink fiber of optical fiber 39'. Remote units 33' may provide their received RF signals directly to primary hub 22 via uplink fibers of optical fibers 39'. The primary hub 22 may then convert the optical signal to a RF electrical signal for transmission of the electrical signal to the base station 15, which may require one or more RF amplification stages. The base station 15 may then provide the output RF signals to the target communication networks (e.g., by distinguishing and selectively distributing via different bands and communication protocols).

FIG. 7 depicts an embodiment of a remote unit 33 in accordance with some embodiments of the present disclosure. Although a remote unit 33 may send and receive signals to one or more hubs or other devices via a variety of transmission mediums (e.g., optical, electrical, wireless, etc.), in an embodiment the remote unit 33 may communicate with hubs via optical fibers. Although remote unit 33 may include different hardware in order to communicate via different transmission mediums, and utilize different hardware and software for each transmission medium, in an embodiment the remote unit 33 may communicate via optical fibers and may include an optical module 52, RF gain stage 54, power gain stage 56, electrical communication path 57, and may be coupled to an antenna 58.

Optical module 52 may be coupled to the optical fiber 39. In an embodiment, optical module 52 may be coupled to separate downlink and uplink fibers 39, such that optical module 52 (or, in some embodiments, multiple optical modules) provides parallel processing of downlink traffic (e.g., requiring optical to electrical conversion from the hub to the antenna) and uplink traffic (e.g., requiring electrical to optical conversion to the hub from the antenna). For the downlink signal, the optical module 52 may detect the envelope of an optical carrier signal and output the wideband of RF signals to a RF gain stage 54 without modulation of the underlying RF signals. For the uplink signal, the RF signals may be provided to the optical module 52 from the RF gain stage 54 as a wideband of RF signals, and the optical module 52 may apply conversion to the optical domain by applying intensity modulation to an optical carrier signal, providing the resulting optical signal to the uplink fiber of optical fiber 39.

RF gain stage 54 may apply a RF gain to the RF signals that are exchanged between the optical modules 52 and the antennas 58 (e.g., via power amplifier 56 and electrical communication path 57). In an embodiment as described in more detail herein, the RF gain stage 54 may employ techniques to apply a significant (e.g., 5×, 10×, 20×, 50×) gain to the RF signal received from either the optical module 52 or antenna 58, while avoiding non-linear distortions (e.g., second order non-linear distortions) from be applied to the RF signals by the amplifiers of the gain stage. Moreover, while the RF gain stage is described herein as being employed at the remote unit 33, it will be understood that the RF gain stage as described herein may be employed at any suitable stage of a system (e.g., electrical, optical, wireless, etc.) at which RF signals need to be amplified, for example, at each of hub 22 and secondary hubs, wherein conversion between optical and electrical signals occurs.

Power amplifier 56, electrical communication path 57, and antenna 58 may provide for the wideband wireless communication interface with the mobile communication devices 18. Power amplifier may accommodate the entire wideband as described herein, providing amplification of transmitted and received signals to and from the antenna (e.g., transmitted and received via a coaxial cable or other similar electrical communication path 57) from a variety of carriers and utilizing a number of different communication protocols, as described herein. In this manner, multiple different mobile communication devices within the physical range of the power amplifier 56 and antenna 58 may transmit and receive communications over their communication networks via DAS 102.

Figure 8:
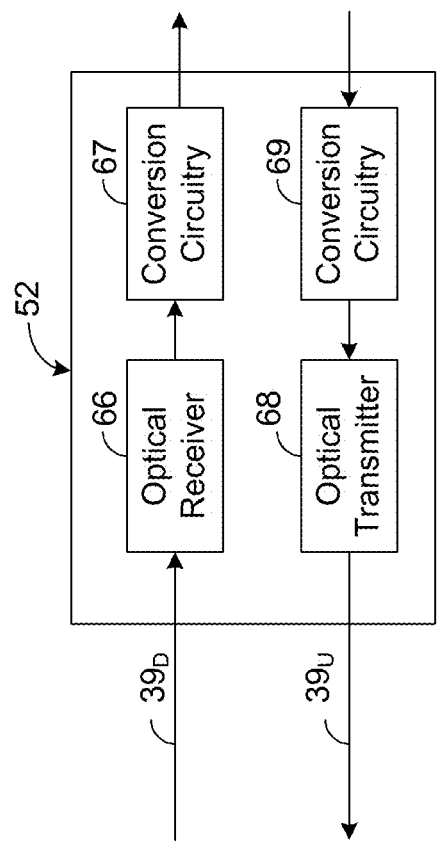
FIG. 8 depicts an illustrative block diagram of an optical module in accordance with some embodiments of the present disclosure.

FIG. 8 depicts an embodiment of an optical module 52 (e.g., of a remote unit 33, primary hub 22, or secondary hub 25). The optical module 52 of FIG. 8 has an optical receiver 66 that is coupled to a downlink fiber of an optical fiber, such as downlink fiber 39D of the optical fiber 39 that is also coupled to the primary hub 22. The optical receiver 66 is configured to receive an optical signal carried by the fiber 39 and convert this signal from the optical domain to the electrical domain. As an example, the optical receiver 66 may include an avalanche photodiode (APD) and associated circuitry for biasing the APD so that the APD has a desired sensitivity for appropriately converting the optical signal to an electrical signal depending on the expected characteristics, such as received signal strength, of the optical signal.

The electrical signal that is output by the optical receiver 66 may be provided to conversion circuitry 67. In an embodiment, conversion circuitry 67 may remove signal content that was added to the underlying RF signal for optical transmission, such as an optical carrier signal. The resulting RF signal may be output for eventual transmission for an antenna, e.g., to a gain stage 54 that amplifies the received electrical signal received via the optical receiver 66, thereby providing a gain (G) to such signal. As will be described in more detail hereafter, the gain stage 54 has circuitry (e.g., one or more RF power amplifiers) for amplifying an electrical signal, and the gain stage 54 processes the received electrical signal in a manner that eliminates second order harmonic distortion without requiring complex circuitry such as parallel amplifier paths.

Note that each of the optical modules 52 may also have an optical transmitter 68 and conversion circuitry 69 similar to the optical receiver 66 and conversion circuitry 67 in the upstream direction, applying an optical carrier to an electrical signal and converting the electrical signal to an optical signal. Similarly, there will be electrical to optical conversions in the downlink path (e.g., at a hub providing an optical signal to another hub or to a remote unit) and optical to electrical conversions in the downlink path (e.g., at a hub receiving an optical signal from another hub or from a remote unit).

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

As a further example, variations of apparatus or process parameters (e.g., dimensions, configurations, components, process step order, etc.) may be made to further optimize the provided structures, devices and methods, as shown and described herein. In any event, the structures and devices, as well as the associated methods, described herein have many applications. Therefore, the disclosed subject matter should not be limited to any single embodiment described herein, but rather should be construed in breadth and scope in accordance with the appended claims.

What is claimed is:

1. A method for reducing second-order non-linear distortion in a wideband system, the method comprising:
receiving an input signal at a first non-linear circuit stage, wherein the first non-linear circuit stage applies an initial second-order non-linear modification to the input signal to provide a first non-linear signal, the initial second-order non-linear modification having an initial first order component and an initial second-order distortion;
providing the first non-linear signal to one or more intermediate circuit stages, wherein the one or more intermediate circuit stages apply at least a linear modification to the first non-linear signal to generate a modified non-linear signal, the linear modification has an intermediate first order component and wherein the modified non-linear signal is inverted with respect to the input signal; and
providing the modified non-linear signal to a second non-linear circuit stage, wherein the second non-linear circuit stage applies an additional second-order non-linear modification to the modified non-linear signal to output an output signal, the additional second-order non-linear modification having an additional first order component and an additional second-order distortion, wherein a ratio of the initial second-order distortion and the initial first order component equals a ratio of the additional second-order distortion and the additional first order component multiplied by an adjustment factor such that second-order distortion is substantially removed from the output signal, and wherein the adjustment factor is equal to a ratio of the initial first order component and the intermediate first order component.

2. The method of claim 1, wherein:
the initial second-order distortion and the additional second-order distortion are substantially identical; and
the initial first order component, the additional first order component and the intermediate first order component are substantially equal.

3. The method of claim 1, wherein the initial first order component is substantially equal to the intermediate first order component.

4. The method of claim 3, wherein the initial first order component is not equal to the additional first order component.

5. The method of claim 1, wherein the intermediate first order component is based on a ratio of the initial first order component squared multiplied by the additional second-order distortion and the additional first order component multiplied by the initial second-order distortion.

6. The method of claim 1, wherein the two non-linear circuit stages provide one of signal amplification or signal attenuation and the one or more intermediate stages provide the other one of signal amplification or signal attenuation.

7. A distributed antenna system comprising:
a first non-linear circuit stage, wherein the first non-linear circuit stage applies an initial second-order non-linear modification to an input signal to provide a first non-linear signal, the initial second-order non-linear modification having an initial first order component and an initial second-order distortion;
one or more intermediate circuit stages coupled to the first non-linear circuit stage to receive the first non-linear signal, wherein the one or more intermediate circuit stages apply at least a first order modification to the first non-linear signal to generate a modified non-linear signal, the first order modification has an intermediate first order component, and wherein the modified non-linear signal is inverted with respect to the input signal; and
a second non-linear circuit stage coupled to one of the one or more intermediate circuit stages to receive the modified non-linear signal, wherein the second non-linear circuit stage applies an additional second-order non-linear modification to the modified non-linear signal to output an output signal, the additional second-order non-linear modification having an additional first order component and an additional second-order distortion, wherein a ratio of the initial second-order distortion and the initial first order component equals a ratio of the additional second-order distortion and the additional first order component multiplied by an adjustment factor such that second-order distortion is substantially removed from the output signal and wherein the adjustment factor is equal to a ratio of the initial first order component and the intermediate first order component.

8. The system of claim 7, wherein:
the initial second-order distortion and the additional second-order distortion are substantially identical; and
the initial first order component, the additional first order component and the intermediate first order component are substantially equal.

9. The system of claim 7, wherein the initial first order component is substantially equal to the intermediate first order component.

10. The system of claim 7, wherein the intermediate first order component is based on a ratio of the initial first order component multiplied by the additional second-order distortion and the additional first order component multiplied by the initial second-order distortion.

11. The system of claim 7, further comprising a hub and a remote unit, wherein the first non-linear stage is located in the hub and the second non-linear stage is located in the remote unit.

12. The system of claim 7, wherein the first non-linear circuit stage and the second non-linear circuit stage each comprise an inverting amplifier.

13. The system of claim 12, further comprising a hub, wherein the hub includes each of the first non-linear circuit stage, one or more intermediate circuit stages, and second non-linear circuit stage.

14. The system of claim 12, further comprising a remote unit, wherein the remote unit includes each of the first non-linear circuit stage, one or more intermediate circuit stages, and second non-linear circuit stage.

15. The system of claim 7, further comprising:
a primary hub connected to a secondary hub;
each of the first non-linear circuit stage and the second non-linear stage includes one or more optical elements; and
each of the first non-linear circuit stage and the second non-linear stage are located at one of the primary hub and the secondary hub.

16. A system for reducing second-order distortion in a wideband system, the system comprising:
a first non-linear circuit stage, wherein the first non-linear circuit stage applies an initial second-order non-linear transfer function to an input signal to provide a first non-linear signal, the initial second-order non-linear transfer function having an initial first order component and an initial second-order distortion;
one or more intermediate circuit stages coupled to the first non-linear circuit stage to receive the first non-linear signal, wherein the one or more intermediate circuit stages apply at least a first order transfer function to the first non-linear signal to generate a modified non-linear signal, the first order transfer function has an intermediate first order component; and a second non-linear circuit stage coupled to one of the one or more intermediate circuit stages to receive the modified non-linear signal, wherein the second non-linear circuit stage applies an additional second-order non-linear transfer function to the modified non-linear signal to output an output signal, the additional second-order non-linear transfer function having an additional first order component and an additional second-order distortion, wherein a ratio of the initial second-order distortion and the additional first order component multiplied by an adjustment factor equals a ratio of the initial second-order distortion and the initial first order component such that the first simplifier stage, the one or more intermediate circuit stages, and the second non-linear circuit stage produces an overall second-order distortion in the output signal that is lower than the either of the initial second-order distortion or the additional second-order distortion, and wherein the adjustment factor is equal to a ratio of the initial first order component and the intermediate first order component.

17. The system of claim 16, wherein:
the ratio of the initial second-order distortion and the initial first order component is substantially equal to the ratio of the additional second-order distortion and the additional first order component; and
the adjustment factor is substantially equal to one.

18. The system of claim 16, wherein:
the ratio of the initial second-order distortion and the initial first order component is not equal to the ratio of the additional second-order distortion and the additional first order component; and
the intermediate first order component is substantially equal to a ratio of the initial first order component squared times the additional second-order distortion and the additional first order component times the initial second-order distortion.

19. The system of claim 16, wherein one of the initial second-order distortion, the additional second-order distortion or the additional first order component includes an inversion.

* * * * *